United States Patent [19]

Kojima et al.

[11] Patent Number: 5,213,949
[45] Date of Patent: May 25, 1993

[54] METHOD FOR SELECTIVELY CURING A LIQUID PHOTOSENSITIVE RESIN BY MASKING EXPOSURE

[75] Inventors: Tsutomu Kojima, Mishima; Takashi Yamashita, Fuji, both of Japan

[73] Assignee: Asahi Kasei Kogyo Kabushiki Kaisha, Osaka, Japan

[21] Appl. No.: 764,959

[22] Filed: Sep. 25, 1991

Related U.S. Application Data

[63] Continuation of Ser. No. 363,404, Jun. 2, 1989, abandoned, which is a continuation of Ser. No. 119,781, Nov. 12, 1987, abandoned.

[30] Foreign Application Priority Data

Nov. 12, 1986 [JP] Japan ................. 61-267715

[51] Int. Cl.⁵ .............................. G03F 7/26
[52] U.S. Cl. ............................ 430/273; 430/306; 430/327
[58] Field of Search ............... 430/273, 306, 327

[56] References Cited

U.S. PATENT DOCUMENTS

| | | | |
|---|---|---|---|
| 1,532,696 | 4/1925 | Hassard et al. | 430/302 |
| 2,058,396 | 10/1936 | Baker | 430/302 |
| 2,760,863 | 8/1956 | Plambeck, Jr. | 430/306 |
| 2,791,504 | 5/1957 | Plambeck, Jr. | 430/276 |
| 2,854,336 | 9/1958 | Gutknecht | 430/323 |
| 3,146,106 | 8/1964 | Hamlin | 430/306 |
| 3,157,505 | 11/1964 | Notley | 430/288 |
| 3,169,066 | 2/1965 | Hoerner | 430/309 |
| 3,210,187 | 10/1965 | Thommes | 430/271 |
| 3,241,973 | 3/1966 | Thommes | 430/271 |
| 3,249,436 | 5/1966 | Halpern | 430/306 |
| 3,408,191 | 10/1968 | Jeffers | 430/253 |
| 3,536,008 | 10/1970 | Ritzerfeld | 101/401.1 |
| 3,615,468 | 10/1971 | Tiala | 430/5 |
| 3,651,759 | 3/1972 | Ritzerfeld | 101/395 |
| 3,661,575 | 5/1972 | Ketley et al. | 430/307 |
| 3,663,222 | 5/1972 | Akamatsu et al. | 430/325 |
| 3,770,435 | 11/1973 | Volkert et al. | 430/307 |
| 3,891,443 | 6/1975 | Halpern et al. | 430/259 |
| 3,936,301 | 2/1976 | Schneider | 430/327 X |
| 3,942,440 | 3/1976 | Ritzerfeld | 101/401.1 |
| 4,046,071 | 9/1977 | Mizuno et al. | 101/395 |
| 4,087,182 | 5/1978 | Alba et al. | 355/100 |
| 4,101,324 | 7/1978 | Mizuno et al. | 430/306 |
| 4,283,484 | 8/1981 | Fairhead et al. | 430/306 |
| 4,600,667 | 7/1986 | Uchida | 430/22 |
| 4,618,550 | 10/1986 | Uchida | 430/11 |

FOREIGN PATENT DOCUMENTS

| | | |
|---|---|---|
| 0046047 | 2/1982 | European Pat. Off. ........ 430/273 |
| 2426610 | 6/1975 | Fed. Rep. of Germany . |
| 388443 | 2/1933 | United Kingdom . |
| 539412 | 9/1941 | United Kingdom . |
| 566795 | 1/1945 | United Kingdom . |
| 1125937 | 9/1968 | United Kingdom . |

*Primary Examiner*—Cynthia Hamilton
*Assistant Examiner*—Kathleen Duda
*Attorney, Agent, or Firm*—Birch, Stewart, Kolasch & Birch

[57] ABSTRACT

An improved method for selectively curing a liquid photosensitive resin by masking exposure is provided, wherein rough, uneven or irregular contact is provided directly or indirectly between the masking film and the substrate. Due to this feature, no interfacial cohesion occurs between the lower surface of the masking film facing the substrate and the upper surface of the substrate facing the masking film. Thus, there are no air pockets formed between the two surfaces. Therefore, there is no danger that the substrate will be caused to protrude into the resin layer so that the ultimate printing plate would have an undesirable local decrease in thickness. As a result, by the method of the present invention, a printing plate having a high degree of uniformity in thickness, can be obtained with reproducibility.

22 Claims, 6 Drawing Sheets

METHOD FOR SELECTIVELY CURING A LIQUID PHOTOSENSITIVE RESIN BY MASKING EXPOSURE

This application is a continuation of application Ser. No. 07/363,404 filed on Jun. 2, 1989, which is a continuation of application Ser. No. 07/119,781 filed Nov. 12, 1987, both now abandoned.

BACKGROUND OF THE INVENTION

1. Field of the Invention

The present invention relates to the production of a printing plate from a liquid photosensitive resin. More particularly, the present invention is concerned with an improved method for selectively curing a liquid photosensitive resin by masking exposure in the production of a printing plate, particularly a flexographic printing plate. The printing plate produced is used in printing a paper container, a corrugated board, a film or the like.

2. Discussion of the Related Art

For the printing of a paper container, a film, a corrugated board or the like by letterpress printing, rubber plates and photoresin plates are used. A photoresin printing plate may be prepared either by processing a solid plate made of a cast photosensitive resin or by forming a layer of a liquid photosensitive resin and exposing the formed resin layer to active rays followed by such steps as removal of the uncured resin, to thereby obtain a printing plate. Incidentally, in letterpress printing such as flexographic printing, the printing plate is required to have a thickness of from 3 to 8.5 mm, for compliance with the mechanical requirements of the printing machine. In the above-mentioned process for preparing a printing plate from a liquid photosensitive resin, in order to produce a printing plate having the large thickness as mentioned above, having a relief which has a large depth and, at the same time, is capable of reproducing fine patterns and nevertheless does not bend or break by the printing pressure, it has been proposed to prepare the printing plate by process steps in which the uncured resin layer is irradiated with active rays from the side opposite to the relief side through a masking film having a transmitting pattern having a contour which corresponds to and is slightly larger than that of the transmitting pattern of an image bearing transparency, to thereby form a shelf portion for supporting a relief portion (this method is the so-called "masking exposure").

Figure 1:
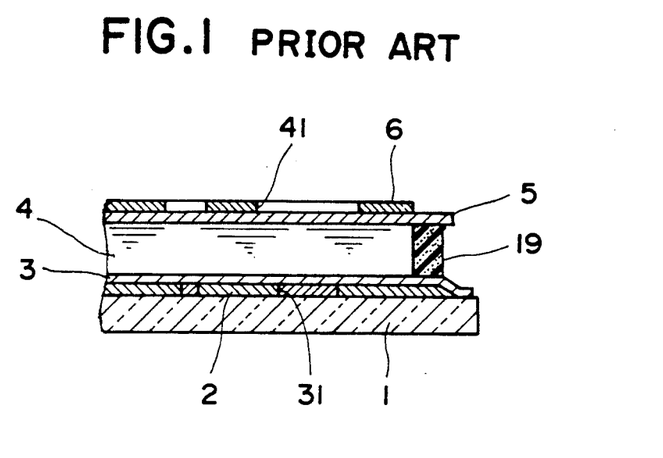
FIG. 1 is a diagrammatic cross-sectional view of a laminated structure which is to be subjected to masking, relief and back exposures.
Figure 2:
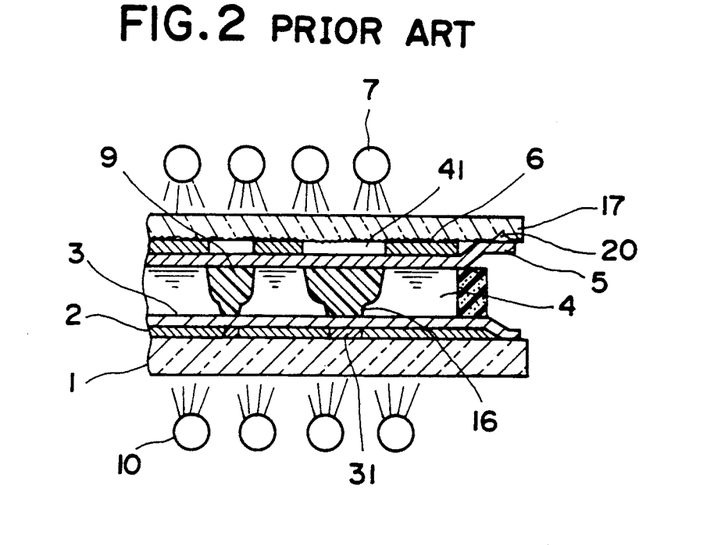
FIG. 2 is a diagrammatic cross-sectional illustration showing an arrangement employed for effecting the masking exposure and the relief exposure.
Figure 3:
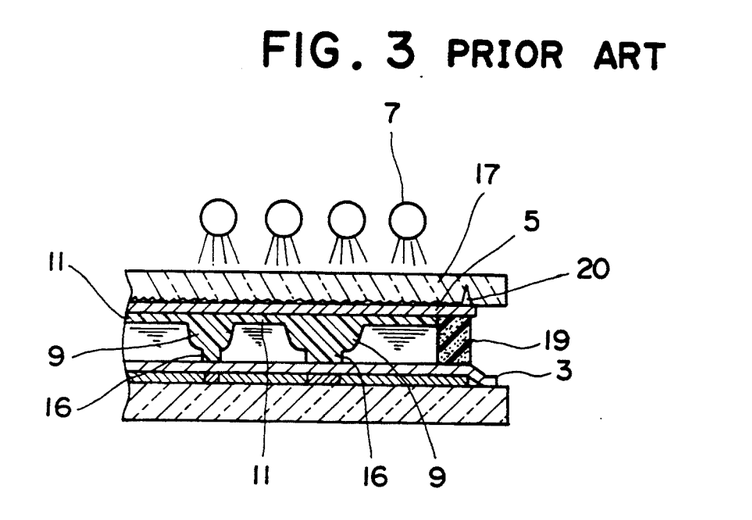
FIG. 3 is a diagrammatic cross-sectional illustration showing an arrangement employed for effecting the back exposure.

Referring to FIGS. 1 to 4, a brief explanation is provided below with respect to an example of the process for preparing a printing plate in which the masking exposure is involved. FIG. 1 is a diagrammatic cross-sectional view of a laminated structure which is to be subjected to masking, relief and back exposures, FIG. 2 is a diagrammatic cross-sectional illustration showing an arrangement employed for effecting the masking exposure and the relief exposure, and FIG. 3 is a diagrammatic cross-sectional illustration showing an arrangement employed for effecting the back exposure.

(1) Lamination [FIG. 1]

Image bearing transparency 2 is disposed on lower rigid plate 1 transparent to active rays, such as a glass plate, which in turn is covered with thin transparent protecting film 3. On protective film covering image bearing transparency 2, a liquid photosensitive resin is poured. Transparent substrate 5, such as a polyester film having a thickness of 0.1 to 0.2 mm, is laminated on the poured resin by a roll laminating method, while simultaneously leveling the resin into layer 4 with a predetermined thickness by applying a pressure to the resin by means of the roller used in the laminating method.

On substrate 5 laminated on liquid photosensitive resin layer 4 having the predetermined thickness, is superposed masking film 6 having a transmitting pattern having a contour which corresponds to and is slightly larger than that of the transmitting pattern of the image bearing transparency so that the position of the transmitting pattern of the masking film is in correspondence with the position of the transmitting pattern of the image bearing transparency. The masking film comprises a transparent film generally having a thickness of 75 to 200 μm with a light-shielding thin film disposed thereon, wherein portions of the thin film which correspond to the desired pattern are cut out to form a transmitting pattern.

(2) Masking exposure [FIG. 2]

An upper light source box positioned above substrate 5 which contains upper light source 7 and whose bottom opening has upper rigid plate 17 which is transparent to the active rays, such as a glass plate, and extends over the bottom opening, is pulled down, so that upper rigid plate 17 is superposed on the masking film. The lower surface of upper rigid plate 17, which faces the masking film, is in a roughened state and has groove 20 provided thereon along the periphery. Groove 20 and the clearance formed between the roughened lower surface of upper rigid plate 17 and masking film 6 is evacuated in order to attract masking film 6 and substrate 5 toward upper rigid plate 17, causing the masking film and the substrate to be pressed against the upper rigid plate. This procedure is employed in order to secure the flatness of each of masking film 6 and substrate 5, thereby serving to produce a printing plate having a uniform thickness and which is free from dents and bumps. The resin layer is then exposed to active rays, such as ultraviolet rays, through the transmitting pattern of masking film 6, thereby selectively curing the resin layer to form shelf portion 9 which is to be a support for relief portion 16 which is later formed.

(3) Relief exposure [FIG. 2]

After the masking exposure, the resin layer is exposed to active rays which are emitted from lower light source 10 through the transmitting pattern (image pattern) of the image bearing transparency to form relief portion 16.

(4) Back exposure [FIG. 3]

After the relief exposure, the upper light source box is lifted and masking film 6 is removed. Then the upper light source box is lowered, and the resin layer is exposed for a short period of time to active rays which are emitted from upper light source 7 to form thin cured resin layer 11 having a uniform thickness in the resin layer over the entire area facing substrate 5. Thin cured resin layer 11 thus formed by the back exposure will be hereinafter referred to as "back layer".

(5) Removal of the uncured resin

After the back exposure, the uncured resin is recovered.

(6) Washing

Figure 4:
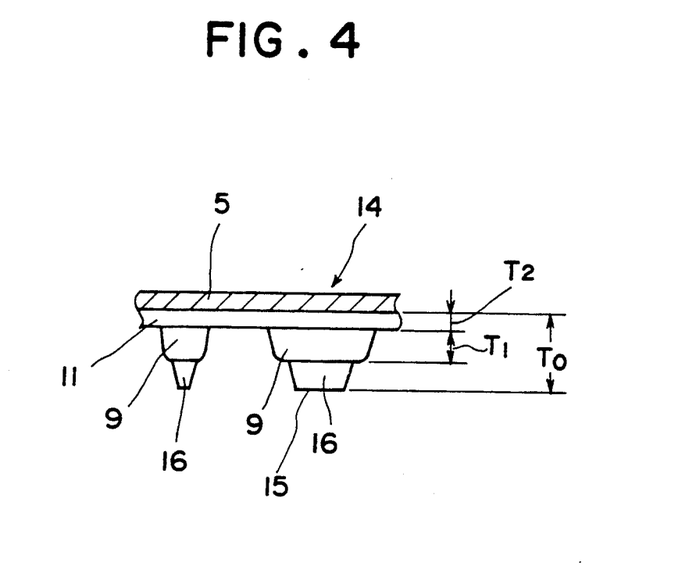
FIG. 4 shows a cross section of a printing plate obtained by a process in which a masking exposure is involved.

The uncured resin remaining is washed out by nozzle washing or brush washing using a wash-out solution, thereby obtaining washed-out plate 14 as shown in FIG. 4.

(7) Post-exposure in water

The thus obtained plate 14 is completely immersed in water and exposed to active rays such as ultraviolet rays which are emitted from a light source to perform a complete curing of the entire plate so that the strength of the plate is increased.

(8) Drying

Plate 14 is removed from the water and dried by blowing the plate with hot air or by the use of an infrared heater.

In the process described above, the shelf portion, the relief portion and the back layer are formed in this order using a masking film having a transmitting pattern having a contour which corresponds to and is slightly larger than that of the transmitting pattern of the image bearing transparency. However, the shelf portion, the relief portion and the back layer may be formed in different ways. For example, the relief portion may be formed prior to or simultaneously with formation of the shelf portion. Further, there may alternatively be employed a method in which the shelf portion and the back layer are formed simultaneously by the use of a masking film provided with a transmitting pattern having a contour which corresponds to and is slightly larger than the pattern of the image bearing transparency, a semitransmitting pattern positioned outside the transmitting pattern and having a large contour for transmitting irradiated active rays upon attenuation, and a blocking surface positioned outside the semi-transmitting pattern and having an effect to block the active rays to an extent not to cure the liquid resin layer (see, for example, U.S. Pat. No. 4,618,550). In the method of U.S. Pat. No. 4,618,550, the masking film comprises a semilight-blocking first blocking film affixed to one surface of a transparent base film for passing active rays upon attenuation, and a second blocking film provided on the other surface of the base film for blocking active rays to such an extent that the rays will not cure the liquid resin used. The first and second blocking films are removably adhered to the base film with an adhesive. The second blocking film has properties to completely block light by itself, or is equal to or higher than the first blocking film in active attenuation ratio, such that when active rays pass through both the first and second blocking films, the rays are attenuated and blocked almost completely by the two blocking films. In the above method, when the laminate is exposed to active rays, the liquid resin layer is cured to a large thickness in corresponding relation to the transmitting patterns of the first and second blocking films to form a shelf portion integral with a relief portion. Where the light through the transmitting pattern of the second blocking film passes through the first blocking film, i.e. a semilight-blocking film and is thereby attenuated, the upper portion of the resin layer is cured to a small thickness in corresponding relation to the transmitting pattern of the second blocking film to form a back layer integral with the shelf portion. As mentioned above, in the method of U.S. Pat. No. 4,618,550, a shelf portion and a back layer are simultaneously formed by the masking exposure and therefore a back exposure is omitted. In the present invention, such masking exposure for forming both the shelf portion and back layer is also defined as "masking exposure".

The thus obtained printing plate 14 has such a construction as shown in FIG. 4. In FIG. 4, numeral 16 designates the relief portion which has been formed by the relief exposure, numeral 15 the surface of the relief portion on which a printing ink is to be applied, numeral 9 the shelf portion which has been formed by the masking exposure, numeral 11 the back layer which has been formed by the back exposure or has been formed simultaneously with formation of the shelf portion by the masking exposure (U.S. Pat. No. 4,618,550), and numeral 5 the substrate. Further, character $T_0$ indicates the total thickness of printing plate 14, character $T_1$ the thickness of the shelf portion and character $T_2$ the thickness of the back layer. For a printing plate having a thickness ($T_0$) of, e.g. 7.0 mm, $T_1$ and $T_2$ are generally in the ranges of 4.8 to 5.8 mm and 1.0 to 1.5 mm, respectively.

From the above-mentioned process, due to the formation of the shelf portion by the masking exposure, there can advantageously be obtained a printing plate having a large thickness and having a relief which has a large depth and, at the same time, is capable of reproducing fine patterns and nevertheless does not bend or break by the printing pressure. In addition, this process is advantageous in that the expensive photosensitive resin remaining uncured can be recovered with a high recovery ratio and, hence, the process is economical. Therefore, this method is widely practiced.

Figure 5A:
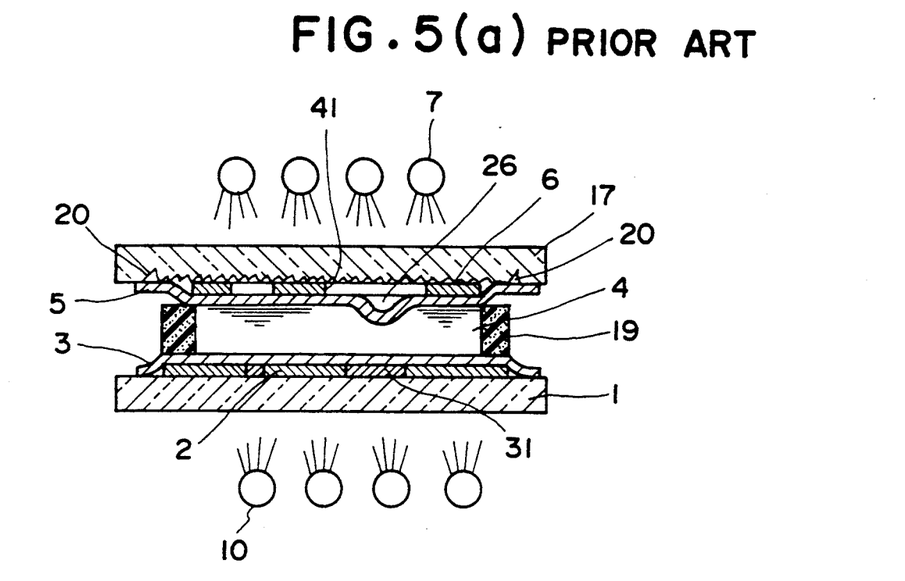

However, the conventional process for preparing a printing plate, in which a masking exposure is involved, has the following problem. The masking film used in the conventional process is composed of a transparent film, such as a polyester film, having smooth surfaces at both sides and a thickness of 0.075 mm to 0.125 mm and, coated on its one surface adapted to face the upper rigid plate to be superposed thereon, a light-shielding thin film wherein portions of the thin film which correspond to the desired pattern are cut out to form a transmitting pattern. That is, the masking film used in the conventional process has a smooth surface at the side facing the substrate. Further, the substrate used in the conventional process is a polyester film of 0.1 to 0.2 mm in thickness and having smooth surfaces at both sides. That is, the surface of the masking film facing the substrate and the surface of the substrate facing the masking film are both smooth. Therefore, as illustrated in FIG. 5 (a), when substrate 5, together with masking film 6, is attracted toward and pressed against upper rigid plate 17 by evacuation in order to secure the flatness of each of masking film 6 and substrate 5 in above-mentioned step (2), a local interfacial cohesion frequently occurs between masking film 6 and substrate 5, causing masking film 6 and substrate 5 to be maintained with air pocket 26 formed therebetween. This air pocket causes the substrate to protrude into the liquid photosensitive resin layer during the operations of masking, relief and back exposures and, therefore, a dent tends to be formed in the cured resin layer, leading to a non-uniformity of the thickness of the ultimate printing plate, i.e. a local decrease in the thickness of the ultimate printing plate. In order to solve this problem, there has been proposed a method comprising, in combination, effecting vacuum-attraction of the substrate toward upper rigid plate 17 intermittently and gradually increasing the vacuum degree in the evacuation for the vacuum-attraction of the substrate. However, it has not been possible to completely prevent the formation of such an air pocket and, thus, the occurrence of the local decrease in the thickness of a printing plate has not been avoided.

SUMMARY OF THE INVENTION

The present inventors have made intensive and extensive studies with a view toward preventing the local interfacial cohesion between the surface of the masking film and the surface of the substrate, which is caused by the smoothness of both the two surfaces and which leads to an undesirable local decrease in the thickness of the ultimate printing plate. As a result, the present inventors have found that the cohesion can be prevented by using a film having at least one surface roughened, as masking film 6 or a film having at least one surface roughened, as substrate 5 or by interposing an intermediate film having both surfaces roughened between masking film 6 and substrate 5 so that rough, uneven or irregular contact is provided directly or indirectly between the masking film and the substrate. Based on this finding, the present invention has been completed.

Accordingly, it is an object of the present invention to provide an improved method for selectively curing a liquid photosensitive resin by masking exposure, which is effective for preventing a local interfacial cohesion from occurring between the masking film and the substrate.

The foregoing and other objects, features and advantages will be apparent to those skilled in the art from the following detailed description and claims taken in connection with the accompanying drawings.

BRIEF DESCRIPTION OF THE DRAWINGS

In the drawing:

FIGS. 1 to 3 show diagrams illustrating a prior art process for preparing a photoresin printing plate, in which

FIG. 5 (a) is a diagrammatic cross-sectional illustration showing how an air pocket is formed between the masking film and the substrate;

FIG. 5 (b) is a diagrammatic side view of the masking film used in the laminate structure shown in FIG. 5 (a), showing the structure of the masking film;

FIG. 5 (c) is a partly cut-away diagrammatic side view of a printing plate obtained using the arrangement shown in FIG. 5 (a), in which the substrate is dented so that the thickness of the printing plate is locally decreased, with the substrate shown in cross section;

FIG. 6 (a) is a diagrammatical cross-sectional illustration showing the arrangement employed for practicing the method of the present invention which is free from the danger that an air pocket is formed between the masking film and the substrate;

FIG. 6 (b) is a diagrammatic side view of the masking film used in FIG. 6 (a), in which the bottom surface is in the roughened state;

FIG. 6 (c) is a partly cut-away diagrammatic side view of a printing plate obtained using the arrangement shown in FIG. 6 (a), in which the thickness of the printing plate is uniform without any dent or bump formed on the substrate, with the substrate shown in cross section;

FIG. 9 (a) is an explanatory view showing a further mode of the method of the present invention, in which there is used a masking film having its lower surface roughened in a different state from that of the masking film shown in FIG. 6 (b), with positional relationship between the masking film, substrate, resin layer, protective film and image bearing layer;

FIG. 9 (b) shows a bottom view of the masking film shown in FIG. 9 (a), illustrating the roughened state in which grooves are formed in a lattice pattern.

In FIGS. 1 to 10, like parts or portions are designated by like numerals or characters.

DETAILED DESCRIPTION OF THE INVENTION

According to the present invention, there is provided a method for selectively curing a liquid photosensitive resin by masking exposure which comprises:

(1) superposing on a lower rigid plate transparent to active rays in the following order, an image bearing transparency having a transmitting pattern or said image bearing transparency having a transmitting pattern which transparency has a transparent protective film disposed on the side remote from said lower rigid plate, a liquid photosensitive resin in the form of a layer, a substrate transparent to active rays, a masking film with a transmitting pattern having a contour which corresponds to and is slightly larger than that of the transmitting pattern of said image bearing transparency, and an upper rigid plate transparent to active rays, said masking film being disposed so that the position of the transmitting pattern of said image bearing transparency is in correspondence to the position of the transmitting pattern of said masking film; and (2) exposing said resin layer to active rays through the transmitting pattern of said masking film, thereby selectively curing the resin layer in conformity with the transmitting pattern of said masking film, the improvement wherein the surface of said substrate on the side facing the lower surface of said masking film is roughened providing rough contact between said masking film and said substrate, wherein the surface of said masking film on the side facing the upper surface of said substrate is roughened providing rough contact between said masking film and said substrate, or wherein said substrate has an intermediate film disposed on the side remote from said liquid photosensitive resin layer, in which both surfaces of said intermediate film are roughened, providing rough contact between said intermediate film and each of said masking film and said substrate.

Figure 6A:
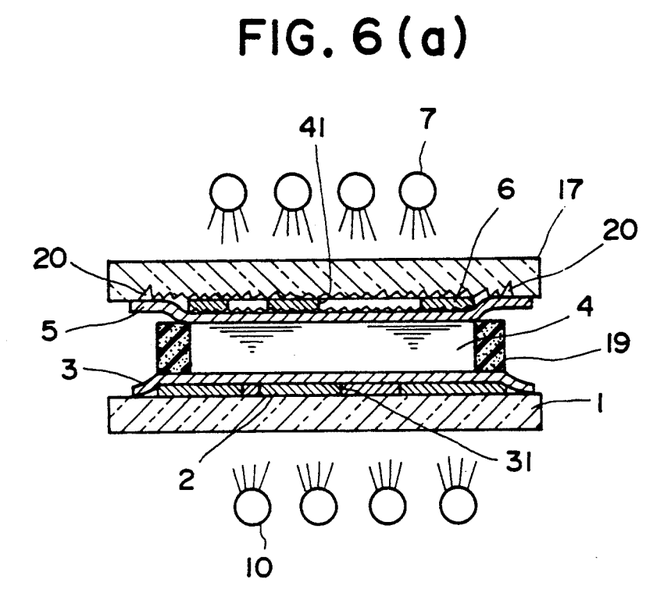

Referring now to FIG. 6 (a), there is shown a diagrammatic cross-sectional illustration showing one mode of the arrangement for practicing the method of the present invention. Image bearing transparency 2 having transmitting pattern 31 is placed on lower rigid plate 1 transparent to active rays and then covered with thin protective film 3 transparent to active rays. On the upper surface of protecting film 3 along its periphery is formed sponge dam 19. In the cavity formed by sponge dam 19, layer 4 of a liquid photosensitive resin is formed. Substrate 5 is laminated on resin layer 4. On substrate 5 laminated on liquid photosensitive resin layer 4 is superposed masking film 6 having transmitting pattern 41 having a contour which corresponds to and is slightly larger than that of image bearing transparency 2 so that the position of transmitting pattern 41 of masking film 6 is in correspondence to the position of transmitting pattern 31 of image bearing transparency 2. Upper rigid plate 17 is superposed on masking film 6. The lower surface of upper rigid plate 17 which faces masking film 6 is in a roughened state and is provided thereon with groove 20 along the periphery. Upper light source 7 used in the masking exposure and back exposure is positioned above upper rigid plate 17, and lower light source 10 used in the relief exposure is positioned below lower rigid plate 1. According to the method of the present invention, rough contact is provided between masking film 6 and substrate 5. Due to this feature, in the present invention, when substrate 5, together with masking film 6, is attracted toward and pressed against upper rigid plate 17 by the evacuation of groove 20 and a clearance formed between the roughened lower surface of upper rigid plate 17 and masking film 6, no local interfacial cohesion occurs between masking film 6 and substrate 5. Therefore, in the present invention, formation of an air pocket between masking film 6 and substrate 5 can be prevented.

Figure 6B:
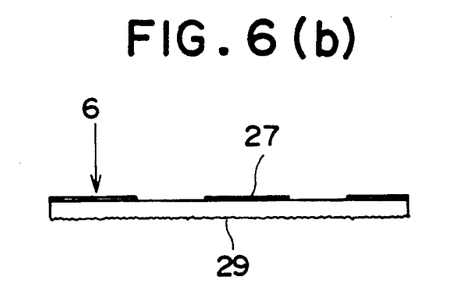
Figure 6C:
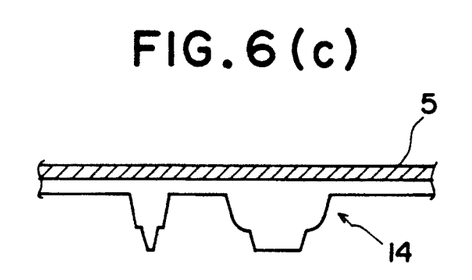

In FIG. 6 (c), there is shown a partly cut-away diagrammatic side view of a printing plate obtained using the arrangement shown in FIG. 6 (a), with substrate 5 shown in cross section. In the arrangement shown in FIG. 6 (a), there are no air pockets formed which would cause the substrate to be locally deformed as mentioned above. Therefore, substrate 5 maintains its flat state during the operations of the masking, relief and back exposures. As a result, by the use of the arrangement shown in FIG. 6 (a), there is obtained printing plate 14 having a uniform thickness without such local deformation of substrate 5 as shown in FIG. 6 (c).

Figure 7:
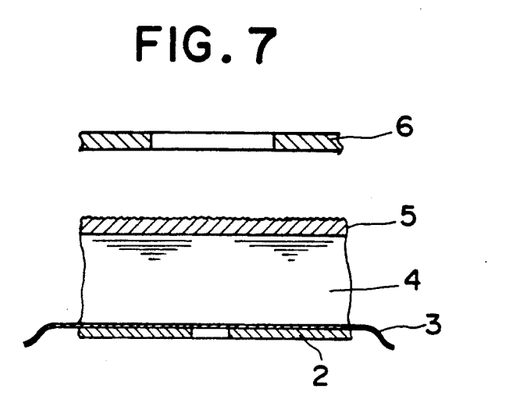
FIG. 7 is an explanatory view showing another mode of the method of the present invention, in which a substrate having its upper surface roughened is used, with the positional relationships between the substrate with the masking film, resin layer, protective film and image bearing transparency.

In the present invention, it is essentially required that rough contact be provided directly or indirectly between the masking film and the substrate. The provision of the rough contact between the masking film and the substrate is effected in one of the following ways:

(a) A film having at least one surface roughened and being transparent to active rays is employed as the substrate and disposed so that the roughened surface of the substrate faces the lower surface of the masking film, providing rough contact between the masking film and the substrate, as shown in FIG. 7.

Figure 9A:
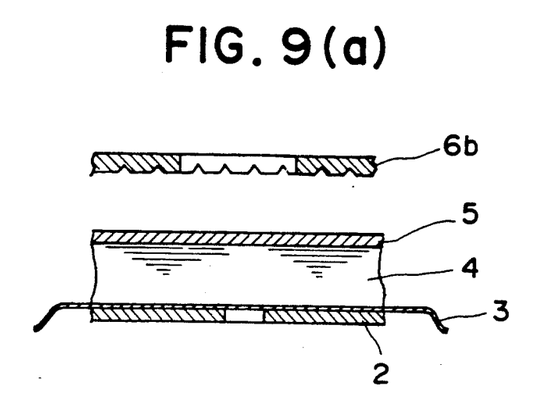

(b) A film having at least one surface roughened and having a transmitting pattern which has a contour which corresponds to and is slightly larger than that of the transmitting pattern of the image bearing transparency is employed as the masking film and disposed so that the roughened surface of the masking film faces the upper surface of the substrate, providing rough contact between the masking film and the substrate, as shown in FIG. 6 (b) and FIG. 9 (a).

Figure 8:
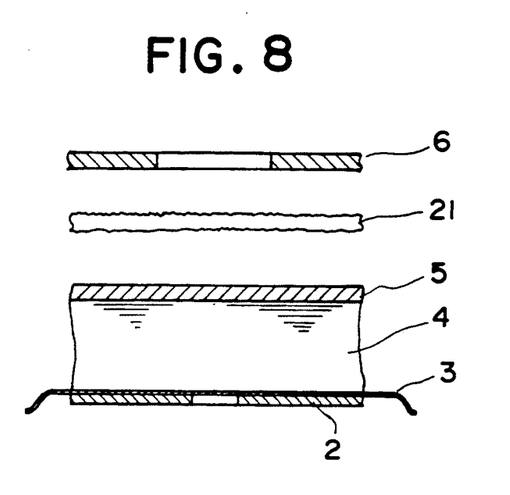
FIG. 8 is an explanatory view showing still another mode of the method of the present invention, in which an intermediate film having both upper and lower surfaces roughened is sandwiched between the masking film and the substrate, with positional relationships between the intermediate film and the masking film, substrate, resin layer, protective film and image bearing transparency.
Figure 10:
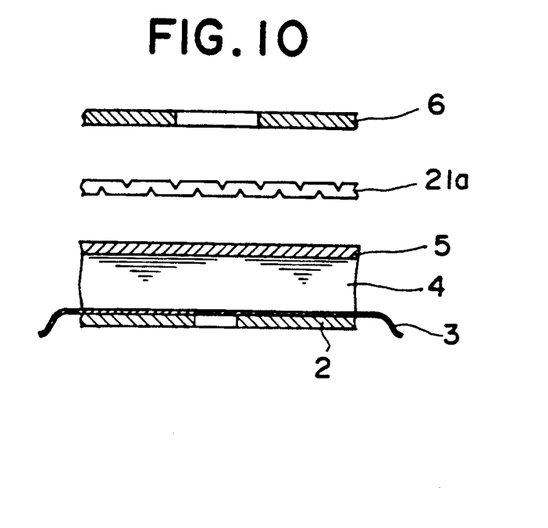
FIG. 10 is an explanatory view showing still a further mode of the method of the present invention, in which an intermediate film having both upper and lower surfaces roughened in a different state from that of the intermediate film shown in FIG. 8 is sandwiched between the masking film and the substrate, with positional relationships between the masking film, intermediate film, substrate, resin layer, protecting film and image bearing transparency.

(c) A film having both surfaces roughened and being transparent to active rays is superposed on the substrate prior to the superposition of the masking film and subsequent to the superposition of the substrate so that the film having both the surfaces roughened which serves as an intermediate film, is sandwiched between the masking film and the substrate, providing rough contact between the intermediate film and each of the masking film and the substrate, as shown in FIG. 8 and FIG. 10.

With respect to each of the cases (a), (b) and (c) mentioned above, the roughening of the surface of the film to be employed for providing direct or indirect rough contact between the masking film and the substrate may be performed by, for example, matting the surface or forming of grooves on the surface. Some examples of the method of the present invention in which rough contact is provided directly or indirectly between the masking film and the substrate in various manners will be described below with reference to the drawings.

Figure 9B:
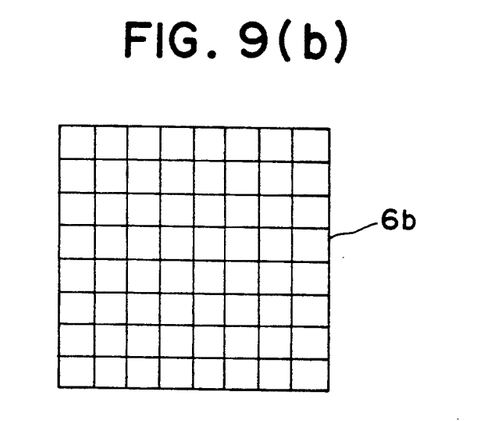

FIG. 6 (b) is a diagrammatic side view of masking film 6 having the lower surface matted, which is employed in the arrangement of FIG. 6 (a). In FIG. 6 (b), numeral 27 designates a light-shielding film and numeral 29 the matted surface. In the method of the present invention, matted surface 29 is brought into contact with the upper surface of substrate 5 to provide rough contact between masking film 6 and substrate 5, as shown in FIG. 6 (a). FIG. 7 is an explanatory view showing another mode of the method of the present invention, in which substrate 5 having its upper surface matted is used. The matted surface of substrate 5 is brought into contact with the lower surface of masking film 6 to provide rough contact between masking film 6 and substrate 5. FIG. 8 is an explanatory view showing still another mode of the method of the present invention, in which intermediate film 21 having both upper and lower surfaces matted is sandwiched between masking film 6 and substrate 5 to provide rough contact between masking film 6 and substrate 5. FIG. 9 (a) is an explanatory view showing a further mode of the method of the present invention, in which there is used masking film 6b having its lower surface grooved to have a plurality of grooves formed thereon. The grooved surface of masking film 6b is brought into contact with the upper surface of substrate 5 to provide rough contact between masking film 6b and substrate 5. FIG. 9 (b) shows a bottom view of the masking film shown in FIG. 9 (a), illustrating a lattice pattern arrangement of the grooves. FIG. 10 is an explanatory view showing still a further mode of the method of the present invention, in which an intermediate film having both upper and lower surfaces grooved is sandwiched between masking film 6 and substrate 5 to provide rough contact indirectly between masking film 6 and substrate 5, namely, between the intermediate film and each of the masking film and the substrate.

The respective thicknesses of the substrate, masking film and intermediate film to be employed in the present invention are shown in Table 1.

Matting of the surface of a film may be effected by subjecting the surface to, for example, sandblasting, chemical etching, embossing or the like. In the case of the matted surface, the surface roughness of the surface may be in the ranges as shown in Table 1 given below. In Table 1, the ranges indicated between parentheses are preferred ranges.

TABLE 1

|  | Thickness (μm) | Surface roughness (μm) |
| --- | --- | --- |
| Matted substrate | 75–200 | 0.3–2.0 |
|  | (100–200) | (0.5–1.5) |
| Matted masking film | 50–150 | 0.3–2.0 |
|  | (75–125) | (0.5–1.5) |
| Matted intermediate film | 50–150 | 0.3–2.0 |
|  | (75–100) | (0.5–1.5) |

In the present invention, the surface roughness is determined by using Alpha-STEP 200 (an instrument for measuring surface roughness manufactured and sold by Tencor Instrument, U.S.A.).

With respect to the matted substrate, matted masking film and matted intermediate film, if the thicknesses thereof are smaller than the lower limits of the above-mentioned respective ranges, they tend to suffer from creases being formed during the handling thereof. These creases would sometimes lead to a local decrease in the thickness of the ultimate printing plate. On the other hand, if the surface roughness is larger than the upper limits, the transparency of these films would undesirably be decreased, leading to a difficulty to place the masking film so that the transmitting pattern of the masking film may be in correspondence to that of the image bearing transparency.

On the other hand, formation of a plurality of grooves on the surface of a film may be effected by scoring the surface with a knife or the like. The pattern of the grooves is not particularly limited but, the grooves may generally be formed in a striped pattern or a lattice pattern. The striped pattern or lattice pattern may be linear or curved. However, from the standpoint of easiness of preparation of the pattern, it is preferred that the relief have a linear pattern. Examples of linear patterns include a horizontally striped pattern, a vertically striped pattern, an aslant striped pattern, an orthogonal lattice pattern and a slanted lattice pattern. The interval between the grooves may be in the range of from 1 to 10 cm, preferably about 3 to 7 cm. The depth of the groove is not particularly limited but may be in the range of from 10 to 30 μm.

In case the surface of the masking film on which the light-shielding film is disposed is roughened, the roughening is preferably effected by matting.

The masking film and the substrate may be made of a material generally employed in conventional processes, i.e. a polyester such as polyethylene terephthalate. Further, the intermediate film may also be made of a polyester such as polyethylene terephthalate.

Each of the substrate, the masking film and the intermediate film preferably has a haze of 60% or more and a UV transmittance (ultraviolet transmittance) of 50% or more from the viewpoint of ease of operation. Since a decreased UV transmittance leads to the necessity of a considerably prolonged exposure time, the higher the UV transmittance the more desirable.

The liquid photosensitive resin to be used in the present invention is not specifically limited as long as it can suitably be used to form a relief. Representative examples of such resins include unsaturated polyester type resins and unsaturated urethane type resins.

As the upper and lower rigid plates to be used in the present invention, which are transparent to active rays, there may be used, for example, an organic glass plate, an inorganic glass plate, and a rigid plastic plate such as a rigid polyvinyl chloride plate and a polymethyl methacrylate (MMA) plate. In this connection, an inorganic glass plate is generally employed.

For preparing a printing plate by a process in which the masking exposure according to the method of the present invention is involved, the relief exposure, back exposure, removal of the uncured resin, washing, postexposure and drying may be effected by the method employed in the conventional processes.

In the above, the present invention has been described with reference to embodiments where use is made of a masking film provided with only a transmitting pattern having a contour which corresponds to and is slightly larger than that of the transmitting pattern of the image bearing transparency. Further, a process for preparing a printing plate in which the masking exposure according to the method of the present invention is involved has been described with respect to the case where the shelf portion, the relief portion and the back layer are formed in this order. However, the present invention is not limited to such embodiments as mentioned above. For example, as mentioned before, use may also be made of a masking film provided with a transmitting pattern having a contour which corresponds to and is slightly larger than the pattern of the image bearing transparency, a semi-transmitting pattern positioned outside the transmitting pattern and having a large contour for transmitting irradiated active rays upon attenuation, and a blocking surface positioned outside the semi-transmitting pattern and having an effect to block the active rays to an extent not to cure the liquid resin layer (see, for example, U.S. Pat. No. 4,618,550). This type of masking film may comprise a semi-light-blocking first blocking film affixed to one surface of a transparent base film for passing active rays upon attenuation, and a second blocking film provided on the other surface of the base film for blocking active rays to such an extent that the rays will not cure the liquid resin used. The first and second blocking films are removably adhered to the base film with an adhesive.

Alternatively, this type of masking film may be modified so that it comprises a first masking film unit which is comprised of a transparent film and a semi-light-blocking film affixed to one surface of said transparent film for passing active rays upon attenuation and a second masking film unit which is comprised of a transparent film and a light-blocking film affixed to one surface of said transparent film for blocking active rays to such an extent that the rays will not cure the liquid resin used. The first and second masking film units are not adhered to each other. In this case, it is necessary that direct or indirect rough contact be provided between the first masking film unit and the second masking film unit. Such direct or indirect rough contact may be provided by, for example, employing as the first masking film unit a film in which the surface of the film on the side facing the second masking film unit is roughened, employing as the second masking film unit a film in which the surface of the film on the side facing the first masking film unit is roughened, or interposing an intermediate film having both surfaces roughened between the first masking film unit and the second masking film unit.

Further, with respect to the exposure of the laminated structure to active rays, the production of a printing plate in which the masking exposure according to the method of the present invention is involved may be performed in various other ways than mentioned before. That is, the relief exposure for forming a relief portion may be effected prior to or simultaneously with the masking exposure for forming a shelf portion, or the shelf portion and the back layer may be simultaneously formed by a masking exposure in which the above-mentioned masking film described in, for example, U.S. Pat. No. 4,618,550 is used. However, it is preferred that the relief exposure be effected after the masking exposure.

In the present invention, as mentioned above, indirect rough contact may be provided between the masking film and the substrate by interposing an intermediate film having both surfaces roughened between the masking film and the substrate. In this connection, it is noted that it is also possible to provide indirect rough contact between the masking film and the substrate either by the method in which the lower surface of the masking film is roughened and an intermediate film having its lower surface roughened is interposed between the masking film and the substrate or by the method in which the upper surface of the substrate is roughened and an intermediate film having its upper surface roughened is interposed between the masking film and the substrate.

As is apparent from the above, in the method according to the present invention, a direct or indirect rough contact between the masking film and the substrate is provided. Due to this feature, no interfacial cohesion occurs between the lower surface of the masking film facing the substrate and the upper surface of the substrate facing the masking film. Thus, between the two surfaces, there is formed no air pocket. Therefore, there is not any danger that the substrate would be caused to protrude into the resin layer so that the ultimate printing plate would have an undesirable local decrease in thickness. As a result, by the method of the present invention, a printing plate having a uniform thickness (degree of uniformity: ± 6/100 mm), which is completely acceptable for use in flexographic printing, can be obtained with reproducibility, as shown in the Examples given later.

Hereinafter, the present invention will be described in more detail with reference to Comparative Example and Examples, which should not be construed to be limiting the present invention.

COMPARATIVE EXAMPLE

A conventional process for preparing a printing plate is described as follows with reference to FIGS. 5 (a), 5 (b) and 5 (c).

(1) Image bearing transparency 2 is placed on lower glass plate 1, and thin transparent protective film 3 is placed on image bearing transparency 2. Then, the gap between the image bearing transparency and lower glass plate 1 is evacuated at a vacuum of 400 mm Hg, thereby attaining a close cohesion therebetween.

(2) A sponge tape of 5 mm in thickness and about 10 mm in width is attached to the surface of protective film 3 along its periphery, thereby forming sponge dam 19 for stemming a liquid resin.

(3) A mixture of 1 part by weight of propylene glycol [number average molecular weight (hereinafter referred to as $\overline{Mn}$): 2000], 1 part by weight of polypropylene glycol adipate diol ($\overline{Mn}$: 2000), and 0.2 part by weight of toluylene diisocyanate was reacted to obtain a polyurethane having isocyanate groups at both terminals. This is further reacted with polypropylene glycol monomethacrylate ($\overline{Mn}$=380), thereby obtaining a polyurethane prepolymer having its both surfaces modified with methacrylate ($\overline{Mn}$: 16500). To 100 parts by weight of the thus obtained prepolymer are added 25 parts by weight of polypropylene glycol monomethacrylate ($\overline{Mn}$: 380), 15 parts by weight of lauryl methacrylate, 10 parts by weight of tetraethyleneglycol dimethacrylate, 1.5 parts by weight of 2,2-dimethoxy phenylacetophenone, and 0.2 part by weight of 2,6-di-t-butyl-p-cresol, thereby to obtain a liquid photosensitive resin. The liquid photosensitive resin is poured into the cavity formed by the sponge dam 19 and levelled into resin layer 4. A film made of a polyester as substrate 5 is then placed on resin layer 4.

Figure 5B:
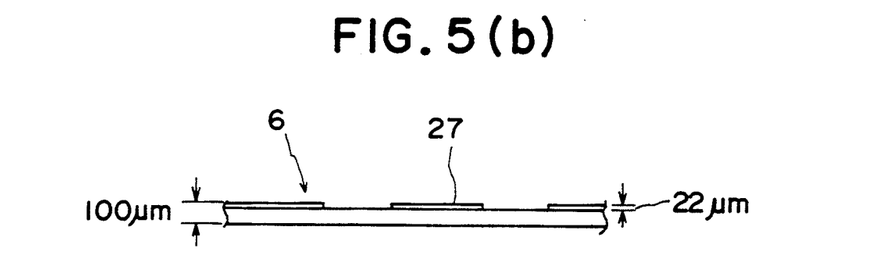
Figure 5C:
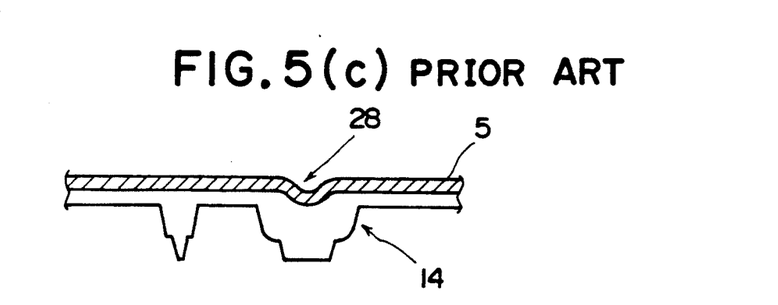

(4) Masking film 6 which is composed of a transparent polyethylene terephthalate film of 100 μm is thickness having a smooth surface and, laminated thereon, light-shielding red film 27 having a thickness of 22 μm as shown in FIG. 5 (b) is placed on substrate 5, so that the position of the transmitting pattern of masking film 6 is in correspondence to the position of the transmitting pattern of image bearing transparency 2.

(5) An upper light source box positioned above substrate 5, which box contains upper light source 7 and whose bottom opening has upper glass plate 17 extending thereover, is pulled down so that upper glass plate 17 is superposed on the masking film. The lower surface of upper glass plate 17 has been roughened, and provided with groove 20 at its peripheral portion.

(6) Groove 20 and a clearance formed between the roughened lower surface of upper rigid plate 17 and masking film 6 are evacuated at a vacuum of 400 mmHg to attract masking film 6 and substrate 5 toward the lower surface of upper glass plate 17, thereby pressing the masking film and the substrate against the upper rigid plate.

(7) After allowing the liquid photosensitive resin layer to stand for a few minutes until the thickness thereof became uniform, the resin layer is subjected to a masking exposure (180 seconds) and a relief exposure (180 seconds). Then, after removing masking film 6, a back exposure is effected for 25 seconds.

(8) Subsequently, in substantially the same manner as described before, the following process steps are conducted; recovery of the uncured resin, washing of the resulting printing plate, postexposure in water and drying, which resulted in the obtainment of a printing plate for printing corrugated boards, having a total thickness of 7 mm, a length of 600 mm and a width of 800 mm. In the thus obtained plate, as shown in FIG. 5 (c), there is dent 28 of 25/100 mm in depth in the thicknesswise direction, which is undesirable for a printing plate.

EXAMPLE 1 (use is made of a matted masking film)

A printing plate is prepared in substantially the same manner as in Comparative Example except that there is employed masking film 6 as shown in FIG. 6 (b), in which the surface facing the substrate (the surface remote from the surface having coated thereon the red light-shielding film) has previously been roughened by sand blasting using sand having a particle size of 80 in terms of Tyler mesh (corresponding to a maximum diameter of 180 μm), instead of the masking film shown in FIG. 5 (b) which has smooth surfaces. The material for the masking film is polyethylene terephthalate. The thickness of the masking film, the haze and the UV transmittance of the transparent film used as the base film of the masking film, the roughness of the matted surface of the masking film and the degree of uniformity in thickness of the obtained printing plate are shown in Table 2. As shown in Table 2, the thus obtained printing plate has a high degree of uniformity in thickness.

EXAMPLE 2 (use is made of a matted substrate)

A printing plate is prepared in substantially the same manner as in Comparative Example, except that instead of the substrate having smooth surfaces, there is employed substrate 5 as shown in FIG. 7 in which the surface facing masking film 6 has previously been matted by sand blasting. The sandblasting is effected in the same manner as in Example 1. The material of the substrate is polyethylene terephthalate. The thickness, the haze and the UV transmittance of the substrate, the roughness of the matted surface of the substrate and the degree of uniformity in thickness of the obtained printing plate are shown in Table 2. As shown in Table 2, the thus obtained printing plate has a high degree of uniformity in thickness.

EXAMPLE 3 (use is made of a matted intermediate film)

A printing plate is prepared in substantially the same manner as in Comparative Example except that, as shown in FIG. 8, intermediate film 21 having both surfaces matted by sand blasting is superposed on substrate 5 prior to the superposition of masking film 6 and subsequent to the superposition of the substrate so that intermediate film 21 is sandwiched between substrate 5 and masking film 6. The sandblasting is effected in the same manner as in Example 1. The material of the intermediate film is polyethylene terephthalate. The thickness, the haze and the UV transmittance of the intermediate film, the roughness of the surfaces of the intermediate film and the degree of uniformity in the thickness of the obtained printing plate are shown in Table 2. As shown in Table 2, the thus obtained printing plate has a high degree of uniformity in thickness.

EXAMPLE 4 (use is made of a grooved masking film)

A printing plate is prepared in substantially the same manner as in Comparative Example except that instead of the masking film having smooth surfaces as shown in FIG. 5 (b), there is employed masking film 6b as shown in FIG. 9 (a) and FIG. 9 (b) in which the surface facing the substrate has previously been grooved using a knife to have grooves of 30 μm in depth in a lattice pattern with intervals of about 3 cm. The material of the grooved masking film is polyethylene terephthalate. The thickness of the masking film, the haze and the UV transmittance of the transparent film used as the base film of the masking film and the degree of uniformity in the thickness of the obtained printing plate are shown in Table 2. As shown in Table 2, the thus obtained printing plate has a high degree of uniformity in thickness.

EXAMPLE 5 (use is made of a grooved intermediate film)

A printing plate is prepared in substantially the same manner as in comparative Example except that, as shown in FIG. 10, intermediate film 21a having both surfaces grooved using a knife to have grooves of about 30 μm in depth in a lattice pattern with intervals of about 3 cm is superposed on substrate 5 prior to the superposition of masking film 6 and subsequent to the superposition of substrate 5 so that intermediate film 21a is sandwiched between substrate 5 and masking film 6. The material of the grooved intermediate film is polyethylene terephthalate. The thickness, the haze and the UV transmittance of intermediate film 21a and the degree of uniformity in the thickness of the obtained printing plate are shown in Table 2. As shown in Table 2, the thus obtained printing plate has a high degree of uniformity in thickness.

TABLE 2

| Example No. | Film conditions in masking exposure | Thickness of film (μm) | Surface roughness depth (μ) | Haze (%) | UV transmission (%) | Uniformity in thickness of printing plate (mm) | |
|---|---|---|---|---|---|---|---|
| Comparative Example | Masking film with both smooth surfaces | 100 | 0 | 80 | 80 | $\pm \frac{25}{100}$ | (at portions intermediate both ends of the printing plate) |
| Example 1 | Masking film with its lower surface matted | 100 | 1.0 | 70 | 70 | $\pm \frac{4}{100}$ | |
| Example 2 | Substrate with its lower surface matted | 100 | 1.0 | 70 | 70 | $\pm \frac{5}{100}$ | |
| Example 3 | Intermediate film with both surfaces matted | 100 | 1.2 (each surface) | 60 | 80 | $\pm \frac{6}{100}$ | |
| Example 4 | Masking film with its lower surface grooved | 100 | 30 (groove portion) | 80 (portions other than groove) | 80 | $\pm \frac{5}{100}$ | |
| Example 5 | Intermediate film with both surfaces grooved | 100 | 30 (groove portion in each surface) | 80 (portions other than groove) | 80 | $\pm \frac{6}{100}$ | |

While an embodiment of the present invention has been described above with reference to the drawings and examples, various modifications and alterations can of course be made by one skilled in the art without departure from the spirit of the invention defined int eh appended claims.

What is claimed is:

1. A method for producing a flexographic printing plate comprising a substrate, a shelf portion disposed on said substrate and a relief portion supported by and formed integrally with said shelf portion and having a predetermined thickness which is in compliance with the requirement for flexography, which comprises:

(1) superposing on a lower rigid plate transparent to active rays in the following order, an image bearing transparency having a transmitting pattern or an image bearing transparency having a transmitting pattern which transparency has a transparent protective film disposed on the side remote form said lower rigid plate, a liquid photosensitive resin in the form of a layer, a substrate transparent to active rays, a masking film with a transmitting pattern having a contour corresponding to and slightly larger than that of the transmitting pattern of said image bearing transparency, and an upper rigid plate transparent to active rays, said masking film being disposed so that the positions of the transmitting patterns of said image bearing transparency and said masking film are in correspondence to each other, wherein rough contact is provided between said masking film and said substrate by employing a film selected from the group consisting of:

(a) a film having at least one surface roughened and being transparent to active rays, said film being employed as said substrate and disposed so that the roughened surface of said substrate faces the lower surface of said masking film, (b) a film having at least one surface roughened and having a transmitting pattern which has a contour corresponding to and slightly larger than that of the transmitting pattern of said image bearing transparency, said film being employed as the masking film and disposed so that the roughened surface of the masking film faces the upper surface of said substrate, and (c) a film having both surfaces roughened and being transparent to active rays, said film being superposed on said substrate prior to the superposition of said masking film and subsequent to the superposition of said substrate so that said film having both the surfaces roughened is sandwiched between said masking film and said substrate; then simultaneously or in either order;

(2) exposing said resin layer to active rays through the transmitting pattern of said masking film, thereby selectively curing the resin layer in conformity with the transmitting pattern of said masking film, to form a cured resin portion corresponding to the shelf portion of a printing plate, and (3) exposing said resin layer to active rays through the transmitting pattern of said image bearing transparency, thereby selectively curing the resin layer in conformity with the transmitting pattern of said image bearing transparency, to form a cured resin portion corresponding to the relief portion of a printing plate;

(4) subjecting the resultant exposed resin layer having said cured resin portion and an uncured resin portion to washing, thereby washing-out said uncured resin portion to obtain a printing plate comprising said substrate, a shelf portion disposed on said substrate and a relief portion supported by and formed integrally with said shelf portion wherein the surface of said substrate on the side remote from said shelf portion is uniformly flat; and (5) washing and drying said printing plate, thereby enabling the obtained printing plate to have a uniformity in thickness of not greater than $-0.06$ mm in terms of the deviation form said predetermined thickness.

2. The method according to claim 1, wherein the roughened surface of each of said film (a), said film (b) and said film (c) is a matted surface.

3. The method according to claim 2, wherein said matted surfaces has a surface roughness of from 0.3 to 2.0 $\mu$m.

4. The method according to claim 3, wherein said matted surfaces has a surface roughness of from 0.5 to 1.5 $\mu$m.

5. The method according to claim 1, wherein the roughened surface of each of said film (a), said film (b) and said film (c) is a surface having a plurality of grooves formed thereon.

6. The method according to claim 5, wherein each groove has a depth of 10 to 30 $\mu$m.

7. The method according to claim 6, wherein said grooves are formed in a striped pattern or a lattice pattern.

8. The method according to claim 7, wherein said grooves are arranged at intervals of from 1 to 10 $\mu$m.

9. The method according to claim 8, wherein said grooves are arranged at intervals of from 3 to 7 $\mu$m.

10. The method according to claim 1, wherein said film (a) has a thickness of 75 to 200 $\mu$m.

11. The method according to claim 10, wherein said film (a) has a thickness of 100 to 200 $\mu$m.

12. The method according to claim 1, wherein said film (b) has a thickness of 50 to 150 $\mu$m.

13. The method according to claim 12, wherein said film (b) has a thickness of 75 to 125 $\mu$m.

14. The method according to claim 1, wherein said film (c) has a thickness of 50 to 150 $\mu$m.

15. The method according to claim 14, wherein said film has a thickness of 75 to 100 $\mu$m.

16. The method according to claim 1, wherein each of said films (a), (b) and (c) has a haze of at least 60%.

17. The method according to claim 1, wherein each of said films (a), (b) and (c) has an ultraviolet transmittance of at least 50%.

18. The method according to claim 1, wherein said masking film is provided with a semi-transmitting pattern positioned outside said transmitting pattern and having a large contour for transmitting the active rays upon attenuation, and provided with a blocking surface positioned outside said semi-transmitting pattern.

19. The method according to claim 1, wherein the film employed by said substrate is film (a).

20. The method according to claim 1, wherein the film employed by said substrate is film (b).

21. The method according to claim 1, wherein the film employed by said substrate is film (c).

22. The method according to claim 1, wherein said predetermined thickness is 3 to 8.5 mm.

* * * * *